United States Patent [19]

Hynecek

[11] Patent Number: 4,779,124
[45] Date of Patent: Oct. 18, 1988

[54] VIRTUAL PHASE BURIED CHANNEL CCD

[75] Inventor: Jaroslav Hynecek, Richardson, Tex.

[73] Assignee: Texas Instruments Incorporated, Dallas, Tex.

[21] Appl. No.: 8,154

[22] Filed: Jan. 22, 1987

Related U.S. Application Data

[63] Continuation of Ser. No. 618,621, Jun. 8, 1984.

[51] Int. Cl.$^4$ .................. H01L 29/78; H01L 29/80; H01L 29/56; H01L 27/14
[52] U.S. Cl. .......................... 357/24; 357/15; 357/22; 357/30; 377/58
[58] Field of Search ............... 357/15, 22, 24, 30; 377/57-63

[56] References Cited

U.S. PATENT DOCUMENTS

| | | | |
|---|---|---|---|
| 3,971,055 | 7/1976 | Arai | 357/22 |
| 4,032,952 | 6/1977 | Ohba et al. | 357/24 M |
| 4,229,752 | 10/1980 | Hynecek | 357/24 M |

OTHER PUBLICATIONS

Kleefstra "A Simple Analysis of CCD's Driven by PN Junctions", Solid-State Electronics, vol. 21, (1978), pp. 1005-1011.

Primary Examiner—Gene M. Munson
Attorney, Agent, or Firm—George L. Craig; James T. Comfort; Melvin Sharp

[57] ABSTRACT

A virtual phase, buried channel CCD with the usual metal gate/oxide structure replaced by a reverse biased junction (possibly a heterojunction) or Schottky barrier is disclosed. Such gate substitution for a standard three phase or multiphase CCD and other devices compatibly fabricated with such gate are also disclosed.

6 Claims, 10 Drawing Sheets

VIRTUAL PHASE BURIED CHANNEL CCD

This application is a continuation of application Ser. No. 618,621 filed June 8, 1984 now abandoned.

BACKGROUND OF THE INVENTION

This invention relates to semiconductor charge transfer devices, and, more particularly, to virtual phase, buried channel charge coupled devices.

Charge transfer devices including charge coupled devices (CCDs) are well known monolithic semiconductor devices and are used in various applications such as shift registers, imagers, infrared detectors, memories, etc. For example, Wolfe and Zissis, Eds, The Infrared Handbook (1978), devote chapter 12 to CCDs and with emphasis on their use in infrared signal processing. The traditional three phase CCD is an array of adjacent cells (each cell, in essence, being a MIS capacitor) and operates by tying the gates of every third cell together so that varying (clocking) the gate voltages in three phases transfers charge packets from cell to adjacent cell. This traditional CCD would be basically formed by covering a p-type substrate with oxide and patterning metal gates on the oxide. In such a device electrons are transferred in the substrate essentially along the interface with the oxide, which leads to poor transfer efficiency due to traps at the interface. Further, such devices have problems including breakdown of the gate oxide, complicated gate connections, blooming (a charge packet larger than the capacity of a cell will overflow into adjacent cells), etc.

The problem of interface trap induced low transfer efficiency can be solved by using a buried channel CCD structure (BCCD) in which the charge packets are confined to and flow in a channel that lies in the substrate beneath the interface. Thus the charge packets are held away from the interface traps and do not exhibit low charge transfer efficiency. However, this arrangement increases dark current generation at the interface. A BCCD can be fabricated by forming an n-type layer on the p-type substrate and then covering it with an oxide layer and patterned metal gates on the oxide. The n-type layer is thin and is fully depleted by the gate clocking action and bias applied to an n+-type junction attached to the end of the channel. The conduction and valence energy band diagram for the device shows the bands that are bent and have a minimum in the n-type layer. This conduction band minimum is the location where the charge packets accumulates and are transferred from cell to cell by variations in the gate bias voltages changing the relative energy band minima between cells. For example, see, Sze, Physics of Semiconductor Devices (2d Ed 1980) pp 423–427.

A BCCD with the standard metal gate/oxide replaced by a p-type gate region to form a p-n junction with the n-type channel layer is also known; see, for example, E. Wolsheimer and M. Kleefstra, Experimental Results on Junction Charge-Coupled Devices, 29 IEEE Trans. Elec. Dev. 1930 (1982). In such a junction BCCD, the control of the energy bands in the buried channel is accomplished by varying the reverse bias on the p-n junction. But such a junction BCCD may have large leakage currents between the adjacent p-type gate regions and also has difficulty in achieving smooth transitions of the buried channel potential energy levels between cells.

The problems associated with the complicated gate structure of such three phase BCCDs are overcome with the virtual phase CCD as described in Hynecek, U.S. Pat. No. 3,2729,752. A virtual phase CCD needs only a single set of gates and a single clocking bias and operates on the principle of selectively doping different regions of each cell so that clocking the gate affects only the energy bands in a portion of each cell and, indeed, drives them from below to above the fixed energy bands in the remainder of each cell. The doped region that shields this remainder of a cell from the effect of the clock bias of the gate voltage is normally called the "virtual gate".

However, all of the prior art devices still suffer from problems of oxide breakdown, blooming, leakage currents, and nonsmooth cell-to-cell potential energy profile transitions.

SUMMARY OF THE INVENTION

A preferred embodiment of the present invention provides a BCCD device with cells built incorporating a p-type substrate covered by an n-type layer (which will include the buried channel) which in turn is covered by a p-type layer (channel barrier) in which an n-type gate region is formed. Additional implants in the p-type channel barrier complete the cell by forming the virtual barrier and well; then n-type gate defines the clocked well and clocked barrier regions (these regions are distinguished from each other by the additional implant in the p-type layer) and the virtual well and virtual barrier regions (again these regions are distinguished from each other by the additional implant in the p-type layer) make up the remainder of the cell. This first preferred embodiment BCCD cell operates in the same manner as a standard virtual phase, buried channel CCD with MOS gates; the MOS gate has essentially been replaced by a reverse biased n - p junction.

A second preferred embodiment BCCD cell has an n-type buried channel layer on a p-type substrate with a p-type virtual gate region on the buried channel separated from a p-type channel barrier region with an n-type clocked gate subregion on the buried channel. Implants in the buried channel and the channel barrier distinguish the virtual barrier and well and the clocked barrier and well, respectively. A third preferred embodiment uses a Schottky barrier in place of the reverse biased n-p junction clocked gate of the second preferred embodiment. And a fourth preferred embodiment employs the same structure as the first two preferred embodiments but uses a different material for the n-type gate so that a heterojunction is formed which permits adjustment of infrared response when the cell is used as a photosite. Further preferred embodiments include a standard, multiphase BCCD with the reverse biased n-p junction gates separated by oxide with underlying p-type regions forming virtual wells, a memory cell with the reverse biased n-p junction as a transfer region, and a charge detector including junction field effect and vertical bipolar transistors.

All of these preferred embodiments overcome the problems of breakdown of the gate oxide by eliminating the necessity for the oxide. Further, all of these embodiments have a built in anti-blooming capability because overflow charge will automatically be drained by the reverse biased junction or the Schottky barrier junction. These preferred embodiments also solve the problems of leakage between gates and nonsmooth transitions of conduction energy band levels between calls. And the ability to fabricate both the CCD cells and the charge detector (output node for the CCD), including transistors, from essentially the same process steps allows for simplicity and process control.

DETAILED DESCRIPTION OF THE PREFERRED EMBODIMENTS

Figure 1:
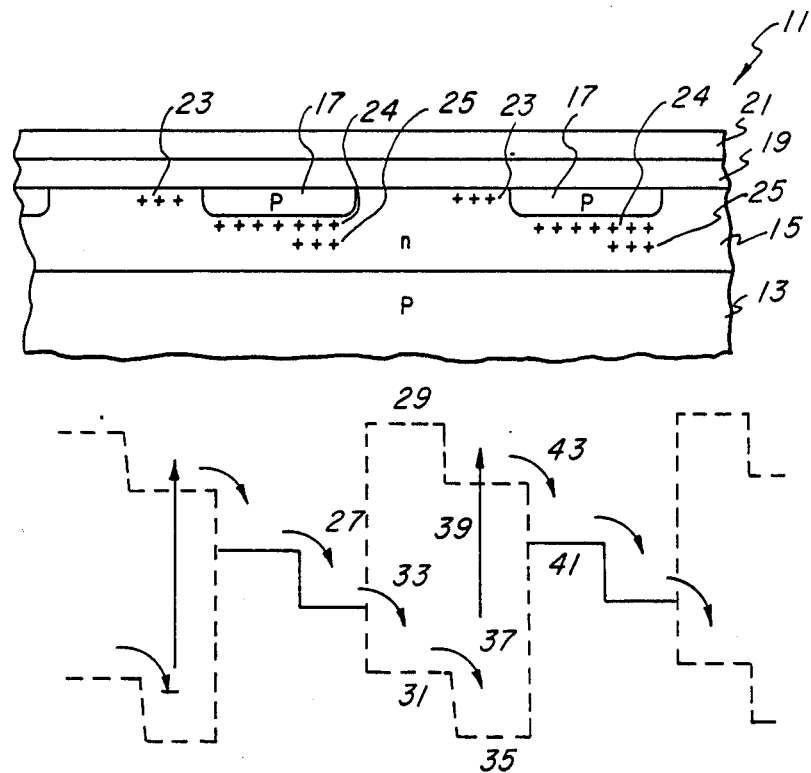
FIG. 1 is a schematic cross section of a standard MOS virtual phase buried channel CCD.

In order to understand the preferred embodiments and their operation, we first consider the standard virtual phase, buried channel CCD and its operation. Turning first to the upper portion of FIG. 1, we see that the standard virtual phase BCCD, generally designated 11, includes a p-type silicon substrate 13, a n-type layer 15 on substrate 13, p-type regions 17 formed in the upper portion of layer 15, oxide layer 19, gate 21 which may be metallization, and donor implants 23, 24 and 25 in the n-type layer 15. The operation of device 11 will be described below and is illustrated by the buried channel potential energy profile shown in the lower portion of FIG. 1 directly below the corresponding regions of device 11. These regions are given the following names: p-type regions 17 are called virtual gates (or virtual electrodes), the portion of layer 15 below both virtual gate 17 and donor implant 25 is called the virtual well, the portion of layer 15 below virtual gate 17 but not below donor implant 25 is called the virtual barrier, the portion of layer 15 not below virtual gate 17 but below donor implant 23 is called the clocked well and the portion of layer 15 below neither virtual gate 17 nor donor implant 23 is called the clocked barrier.

Figures 2A, 2B:
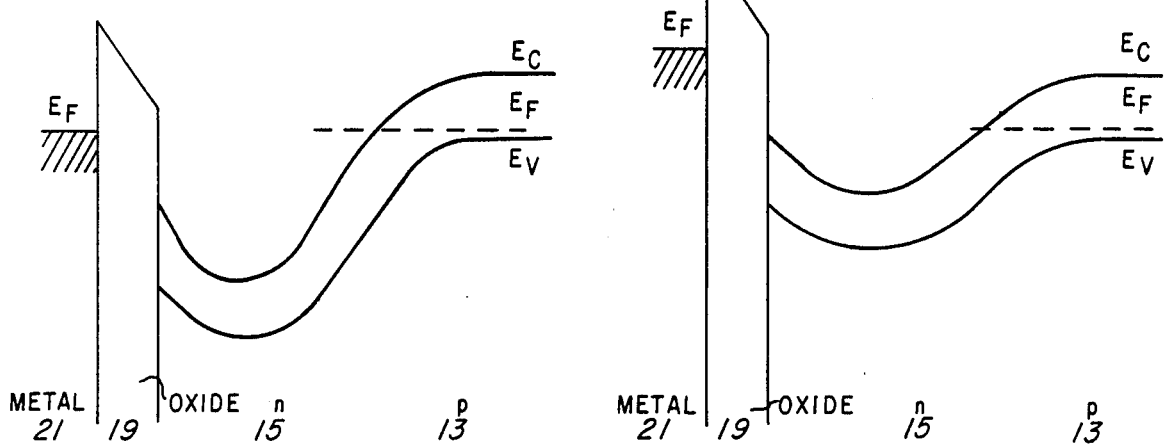
FIGS. 2A-D show the conduction and valence bands for the device of FIG. 1.

FIGS. 2A-D illustrate the conduction and valence energy bands and show the buried channel feature. In particular, from left to right, FIG. 2A shows the bands as a function of distance measured from the metal gate vertically downwards through the clocked barrier region and with the gate 21 at about approximately the same bias as substrate 13. This band bending arises from the depletion of n-type layer 15, which is relatively thin. The curvature of the bands shown in FIG. 2A shows the existence of the buried channel. If a free electron were introduced into layer 15, then it would fall to the minimum of the conduction band, which is located away from the oxide 19 silicon interface.

Figure 2C:
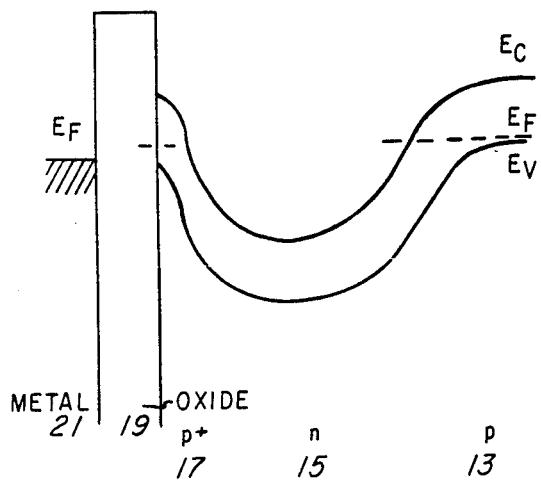
Figure 2D:
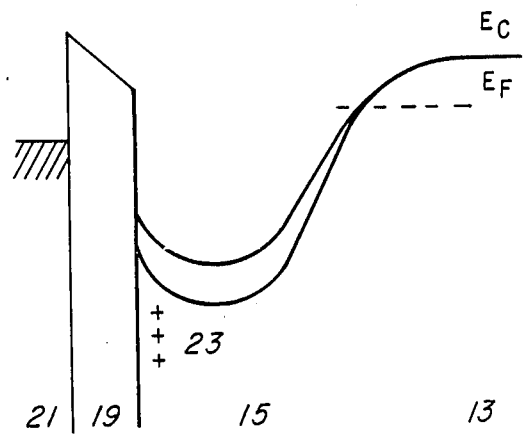

FIG. 2B shows the change in the bands of FIG. 2A upon application of a negative bias to gate 21. In essence, the potential energy at the buried channel (the minimum of the conduction band) is raised (for electrons). FIG. 2C shows the corresponding band diagram for the virtual barrier region. FIG. 2D compares the conduction band for the clocked well region with the conduction band for the clocked barrier region, the valance bands being omitted for simplicity. The lower band is for the clocked well region and has a lower minimum due to the positive donor charge 23, which is also illustrated in FIG. 2D. Analogously, the energy bands for the virtual well region are similar to those of FIG. 2C, except that the donor change 25 depresses the minimum as in FIG. 2D. The bands shown in FIG. 2C do not move up and down with a change in the bias of gate 21 because virtual gates 17 are connected to the p-type channel stops (not shown in FIG. 1 but which run parallel to the buried channel and which are connected to the p-type substrate 13) and thus are effectively pinned at the bias of substrate 13.

The operation of device 11 can now be explained. Turning to the lower portion of FIG. 1, the energy levels for an electron in the buried channel (conduction band minimum) are shown for the various regions of device 11 and for gate 21 being both approximately at substrate 13 bias and at a negative bias with respect to substrate 13. Starting with an electron in the virtual barrier region, the operation is as follows. First the electron falls into the virtual well region, this is shown diagramatically by arrow 27 in the energy level diagram part of FIG. 1. Next, if gate 21 is turned on (negative with respect to substrate 13), then the electron will remain in the virtual well because the energy levels of both adjacent regions are higher, the energy level of the clocked barrier in this state is denoted 29 in FIG. 1. When the gate 21 is turned off (bias approximately equal to substrate bias 13) then the energy level of the clocked barrier drops to the position 31 and the electron passes from the virtual well into the clocked barrier as illustrated by arrow 33 in FIG. 1. The electron continues and falls into the clocked well 35 as shown by arrow 37. The electron remains in the clocked well until gate 21 is turned on at which time the energy levels of the clocked barrier and clock wells both rise as shown by arrow 39 in FIG. 1. Once the energy level of the clocked well increases to greater than that of virtual barrier level 41, the electron falls out of the clocked well and into the virtual barrier as shown by arrow 43. Thus the electron is back in the virtual barrier region but in the cell adjacent the starting cell of device 11. Movement of the electron to further cells is just a repeat of the same steps and clocking of the gate 21. With the operation of the virtual phase device 11 now in mind, we can describe the structure in operation of the preferred embodiments of the present invention.

Figure 3:
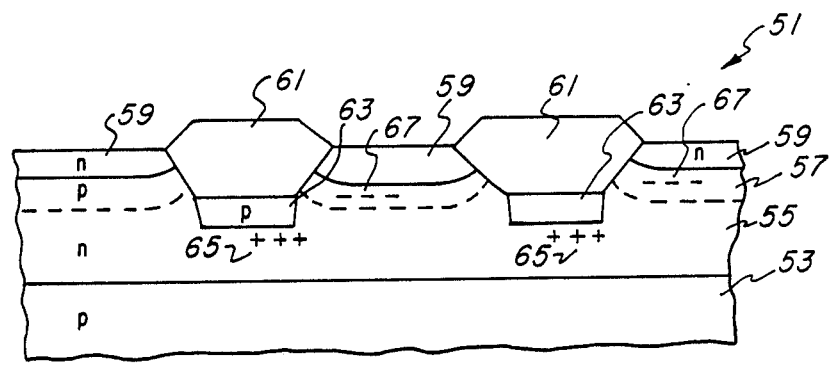
FIG. 3 is a schematic cross section of a first preferred embodiment CCD with reversed bias junction gates.
Figure 3:
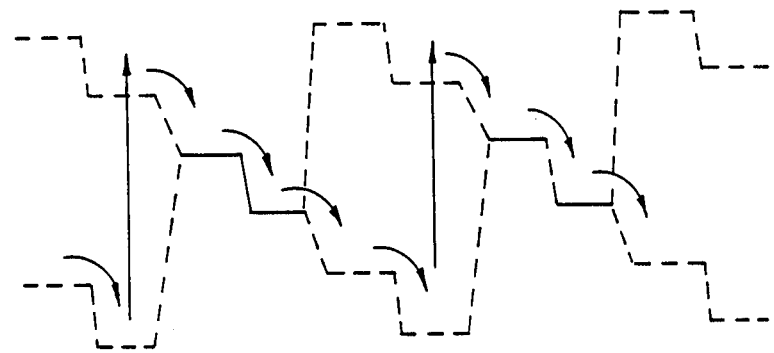
Figure 4:
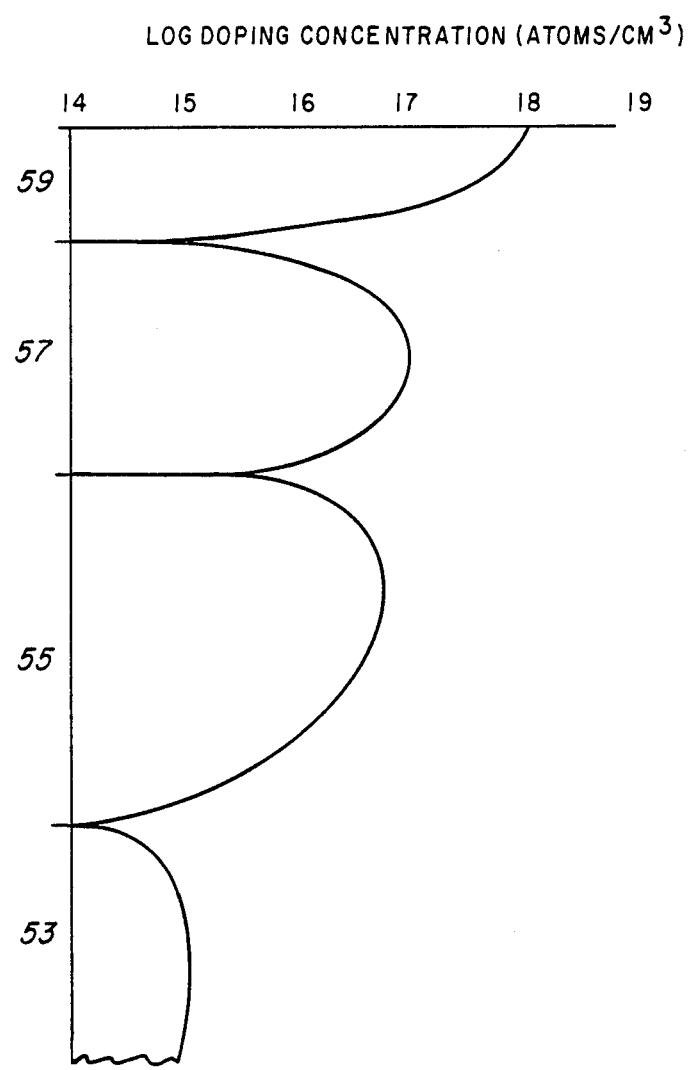
FIG. 4 shows the doping profiles for the device of FIG. 3.

The upper portion of FIG. 3 shows a schematic cross section of some cells of first preferred embodiment BCCD device 51. Device 51 includes a lightly doped (1E15 acceptors/cm$^3$) p-type substrate 53, n-type layer 55 with a doping level of approximately 5E16 and a thickness of approximately 370 nm, p-type layer 57 with doping of approximately 8E16 and a thickness of approximately 250 nm, p-type layer 59 of doping approximately 1E18 and a thickness of approximately 120 nm, oxide regions 61, virtual gates 63 which are p-type and extend to the channel stops as previously described in device 11 and will be further described below, donor implants 65 in layer 55 and covering approximately half of the bottom side of virtual gates 63, and acceptor implants 67 in regions 57 and covering approximately one half (but not necessarily) of the underside of the regions 59. Note that the extent of implants 65 and 67 (illustrated as approximately one half of regions 63 and 59, respectively) could be varied to advantage in certain device applications. FIG. 4 shows the doping profile and is a graph of the logarithm of the doping concentration plotted horizontally versus the distance from the top of device 51 at region 59 and plotted vertically downwards. These regions have the following self-explanatory names: region 59 is the gate, region 57 the channel barrier, region 55 the buried channel, and region 53 the substrate.

Figure 5A:
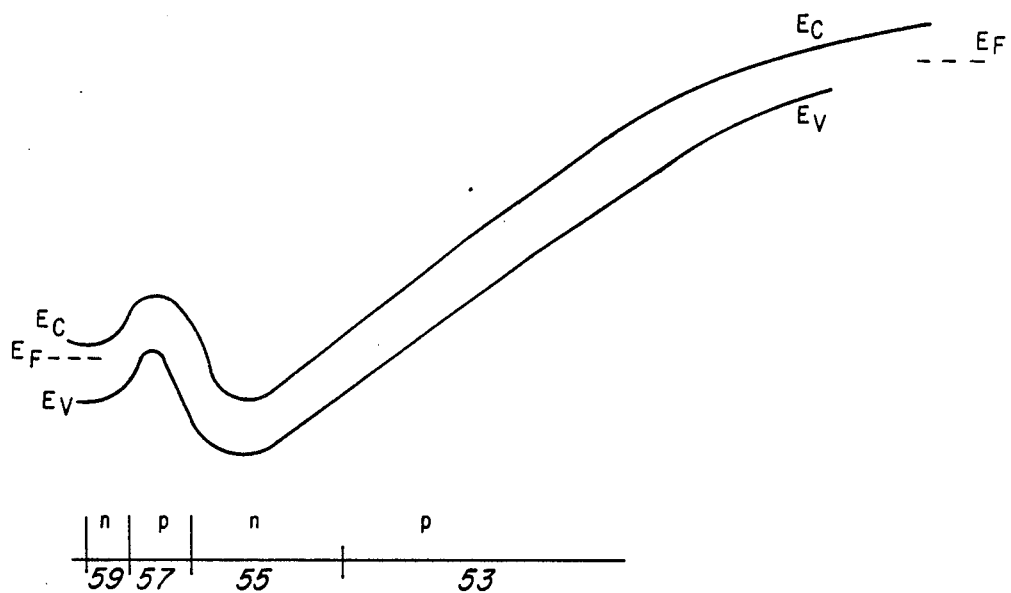
FIGS. 5A-B show the conduction and valence bands for the device of FIG. 3.

If a positive bias with respect to substrate 53 is applied to gate 59, then the energy bands appear as in FIG. 5A-D. In particular, FIG. 5A shows the bands for gate 59 being about 6 volts with respect to substrate 53; note that the depletion extends far into substrate 53 due to its light doping. Of course, buried channel 55 and channel barrier 57 are fully depicted (it is not necessary that the channel barrier is depleted of holes for all gate bias conditions), whereas gate 59 is heavily doped and only partially depleted. The form of energy bands in FIG. 5A is similar to that of FIG. 2A. If the bias on gate 59 is varied relative to substrate 53, then the bands of FIG. 5A move up and down analogously with the movement of the bands illustrated in FIGS. 2A and 2B when the gate 21 bias of device 11 is varied.

Figure 5B:
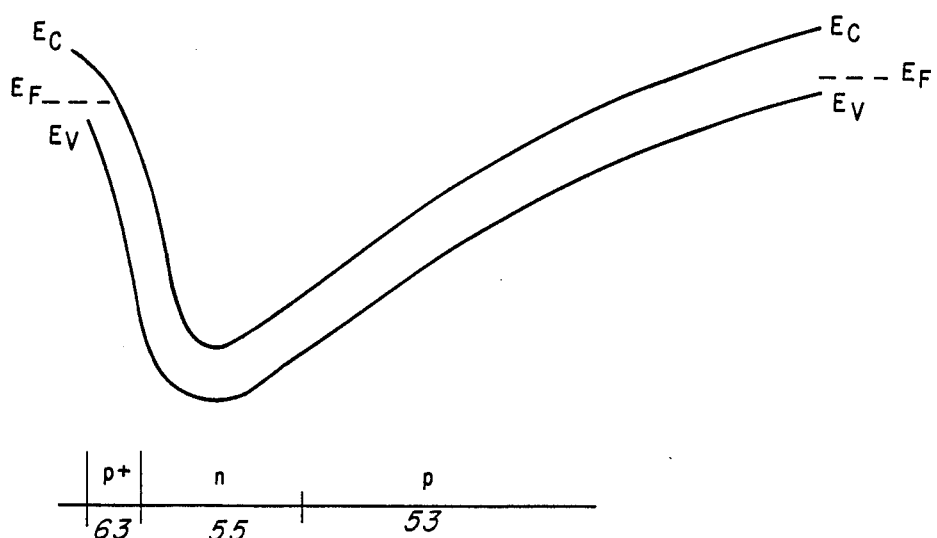

FIG. 5B shows the energy bands under the virtual gate 63; these are analogous with the bands of FIG. 2C, and as with virtual gate 17, virtual gate 63 is connected to the channel stops and thus bands are invariant as the bias on clocked gate 59 is varied. Donor implants 65 and acceptor implants 67 both affect the energy bands in a manner analogous to the donor implants 23 and 25 in device 11; namely, the bands are shifted a fixed amount near the minimum. Consequently, device 51 has the same definition of the buried channel as the minimum of the energy bands and the same partitioning of a cell into a clocked barrier region, a clocked well region, a virtual barrier region, and a virtual well region as device 11. Thus, device 51 will operate in the same manner as device 11. This operation is illustrated in the lower portion of FIG. 3 which shows the energy levels at the conduction band minimum and flow of electrons in the manner of the lower portion of FIG. 1.

Although the operation of device 51 is analogous to the operation of device 11, the advantage of device 51 include the elimination of the oxide 19 of device 11. No oxide breakdown under gate bias can occur in device 51 because the only oxide 61 is for isolation of the busses for the clocked gates 59 and can be made relatively thick. Also, the reverse bias of the junction formed by clocked gate 59 and channel barrier region 57 acts as a drain for overflow charge associated with blooming; thus, as an electron charge packet in a cell is increased in size the presence of charge raises and flattens the minimum in the energy bands (both in device 11 and in device 51), and a portion of the charge packet will overflow into adjacent cells in device 11. In contrast, overflow charge from a large charge packet will spill over into channel barrier region 57 and then into clock gate 59 rather into an adjacent cell in device 51; this is not possible in device 11 because the oxide 19 is nonconducting. Also, note that channel barrier regions 57 prevents electrons from clocked gate 59 from falling into the buried channel and saturating it; recall that region 55 is depleted. Additionally, leakage current between clocked gates 59 and the virtual gates 63 is negligible provided the reverse bias junction breakdown is avoided, yet the buried channel conduction bands have smooth transitions from cell to cell.

Further understanding of the operation of device 51 can be obtained from a description of a preferred embodiment method of fabrication of device 51. Such preferred embodiment method of fabrication is as follows. The starting material can be a substrate (100) p+-type silicon with a 10 micron thick epitaxial layer of p-type with carrier concentration $1E15/cm^3$. Standard self aligned thick oxide (SATO) step sequences are applied to define the active region and peripheral region of the device. The following discussion will focus only on the active regions of the device.

Figure 6A:
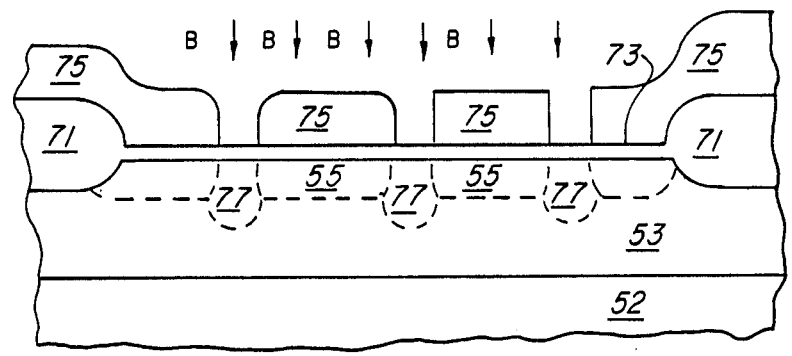
FIGS. 6A-E show the fabrication steps for making the device of FIG. 3.

A 200A oxide is grown in the active areas after the original SATO nitride and oxide have been removed. This step is followed by a uniform phosphorous buried channel implant (no mask) with the dose preferably being $1.8E12/cm^2$ and energy 300keV. Next a mask patterning and a high energy low dose boron implant defines the channel stop region. FIG. 6A shows a schematic cross section indicating the p+-type substrate 52, p-type epitaxial layer 53, thick oxide 71, 200A oxide layer 73, phosphorous doped buried channel region 55, photoresist pattern 75, and boron implanted channel stop regions 77. Note that the view in FIG. 6A is perpendicular to the view in FIG. 3 and that the transfer of charge packets will be perpendicular to the paper in FIG. 6A.

Figure 6B:
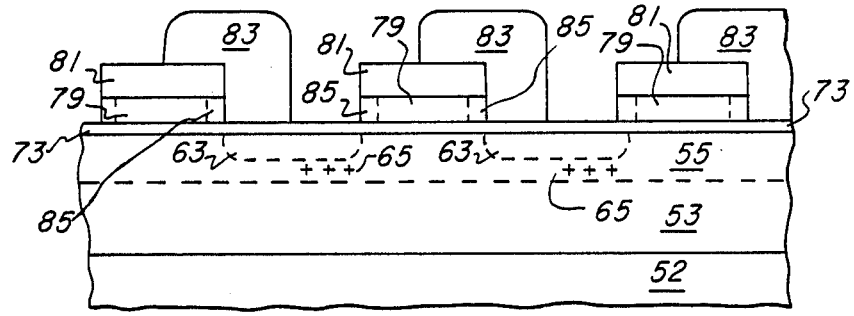

After the boron and phosphorous implants and necessary photoresist clean-up, a patterned layer of nitride and oxide is deposited as shown in FIG. 6B; note FIG. 6B is a view parallel to the view of FIG. 3 and perpendicular to the view of FIG. 6A. Nitride layer 79 is preferably 1800 A thick and oxide layer 81 is preferably 4000 A thick. After the oxide 81 and nitride 79 are patterned, a boron implant is used to define virtual gates 63, which extend across the channel stops 77. Next a well mask photoresist 83 is patterned and a phosphorous well implant 65 is made. After removal of photoresist and clean-up, oxide 81 is removed and the device 51 is subject to oxidation. Optionally, before the oxidation and oxide 81 removal an additional nitride 79 etch is applied to form an undercut in nitride 79 which is used to control the interface regions between the virtual and clocked gates; such an optional undercut is designated by 85 in FIG. 6B. This undercut step allows for precise control of the electrical field between the clocked gate 59 and virtual gate 63. This control is necessary for achieving a smooth energy level transition from cell to cell and at the same time provides a high reverse breakdown voltage between gates 59 and 63. This is in contrast to the prior art BCCD with p-type gates where generation of potential barriers between the gates to prevent leakage between the gates necessarily led to creation of nonsmooth cell to cell energy level transition profiles and formed parasitic wells and barriers which increased the transfer inefficiency. Typically, undercut 85 is one to two microns, and nitride 79 and oxide 81 are five to ten microns wide.

Figure 6C:
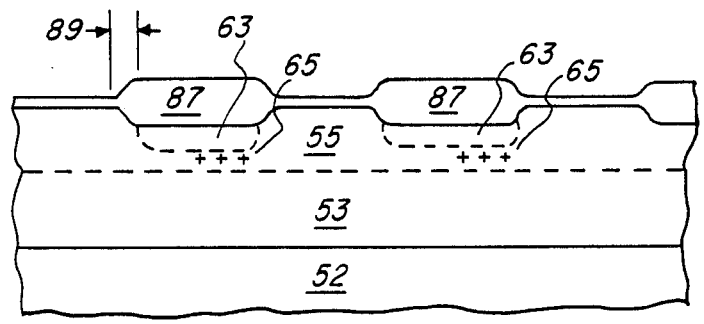
Figure 6D:
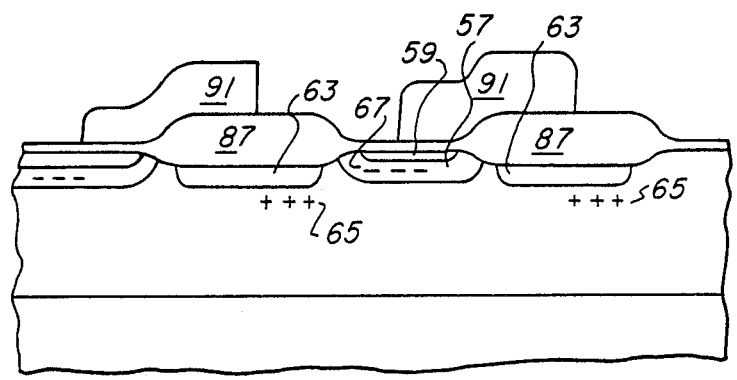
Figure 6E:
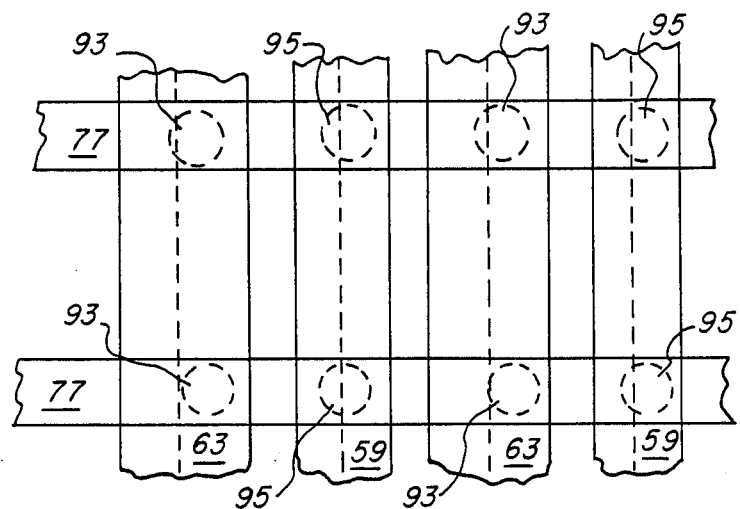

After oxidation, the remaining nitride 79 is removed and the device is ready for formation of the clocked gate and barrier; see FIG. 6C, and the oxide 87 may be 4000 Å thick. If the optional undercut 85 of nitride 79 had been performed, then oxide 87 will extend beyond virtual gate 63 by the amount of the undercut, this is shown as the distance 89 in FIG. 6C. Other combinations of materials are possible in place of the nitride and oxide stack; for example, polysilicon and nitride. Next the p-type channel barrier region 57 is formed by boron implant, preferably at a density of $2.4E12/cm^2$ at 90 keV. Next the n-type clocked gate 59 is formed by phosphorous implant at a density of $5E12/cm^2$ at 40keV. Lastly, the clocked barrier implant of boron a density of $1.6E12/cm^2$ at 70keV is made after barrier mask 91 is patterned. The resulting structure is shown in FIG. 6D. FIG. 6E shows a simplified plan view of the foregoing structure, and because channel stops 77 are only of a low dose they can be depleted by the clocked gate 59, so an additional high does, low energy channel stop implant is made at the connection of virtual gate 63 with channel stop 77. This implant is designated 93 and is of sufficient energy to connect the virtual gate 63 with substrate 52. This high dose implant step is most conveniently made after the virtual gate and barrier implants.

To achieve high frequency operation, the high sheet resistance of the clocked gate 59 must be overcome; this is done by covering the device with an oxide layer and forming contact holes in the oxide to the clocked gates 59, preferably at regions 95 (FIG. 6E) over the channel stops 77. A low resistance layer, such as polysilicon, molybdenum, titanium-tungsten, etc. is deposited on the oxide layer and makes contact to clocked gates 59 through the openings 95. Preferably such low resistance layer is in the form of a buss located over the channel stops 77. Such buss location is advantageous if the cells are being used for optical or infrared detection.

The gate structure of device 51 has low leakage current because the gate-channel barrier is always reversed biased.

Device 51 can be incorporated into many different products, such as area imagers, frame transfer, interline transfer, line addressed, as well as linear imagers. The relative dimensions of the virtual gate 63 and the clocked gate 59 can change depending on the application. For example, use only of the virtual gates 63 are photosites for the collection of photogenerated charge and interfacing this with another CCD structure or charge sensing amplifier is possible.

Figure 7:
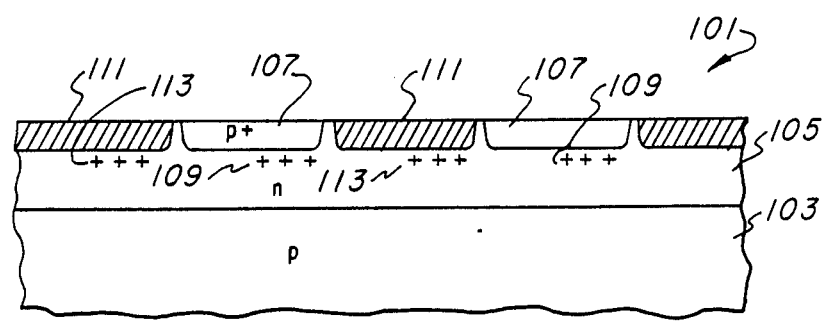
FIG. 7 shows a second preferred embodiment CCD with Schottky junction gates.
Figure 7:
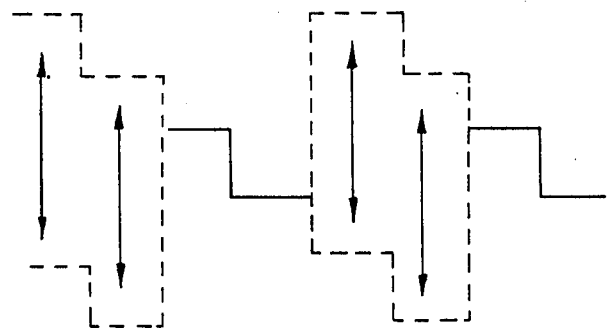

A second preferred embodiment includes the use of Schottky barriers in place of the gate and channel barriers of the first preferred embodiment device 51. More particularly, FIG. 7 shows a schematic cross sectional view of second preferred embodiment device, generally denoted 101. Device 101 includes a p-type substrate 103, and n-type channel region 105, p-type virtual gate regions 107, donor implants 109, metal gates 111 which form Schottky barriers with layer 105, donor implants 113, and channel stops which are not shown and run parallel to the cross section of FIG. 7. Metal gates 111 extend from channel stop to channel stop and thus span both the p-type channel stops and the n-type channel region 105 (this is analogous to the gates 59 of device 51 extending beyond channel barrier region 57 onto channel stop 77, as shown in FIG. 6E). Thus if metal 111 is chosen so hat its work function lies between the work function of the p-type material of layer 103 and the n-type material of layer 105, then Schottky barriers will be formed both at the junction between gate 111 and layer 105 and gate 111 and the channel stops. Note that if the metal 111 work function is too close to the p-type material work function, then there will be a substantial hole current from metal gate 111 to the channel stops which will cause large power dissipation and ohmic potential drops along buss lines as well as in the substrate. Conversely, if the work function of the metal 111 is too close to the work function of the n-type material, there will be a large dark current (barrier leakage current) that will saturate the buried channel and make device 101 inoperable.

Figure 8:
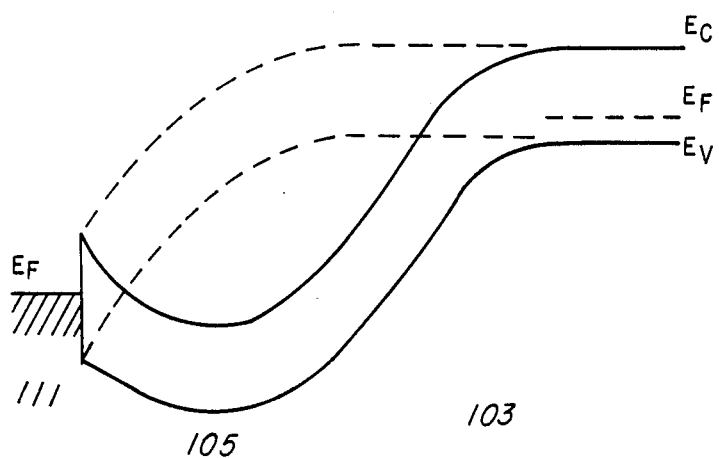
FIG. 8 shows the conduction and valence bands for the device of FIG. 7.

The operation of device 101 is analogous to that of devices 11 and 51 explained above. In particular, the Schottky barrier formed by metal gate 111 and n-type layer 105 is reversed biased; this, along with the depletion due to the n-p junction between layers 105 and 103, causes the conduction band energy level and the valence energy band to have a minimum as shown in FIG. 8. As with devices 11 and 51, the minimum of the energy bands for device 101 defines the buried channel. Note that FIG. 8 also shows the conduction band and the valence band for the Schottky barrier formed between metal gate 111 and the p-type channel stop; these energy bands are shown as dotted lines in FIG. 8.

The effect of implants 109 and 113 in device 101 is analogous to the effect of implants 23 and 25 in device 11 and implants 65 and 67 in device 51 in that the implants, in effect, split the regions below the virtual gates 107 into the virtual barrier and virtual well regions in the buried channel and split the regions under metal gates 111 into the clocked barrier and clocked well regions in the buried channels. Analogous to the lower portions of FIGS. 1 and 3, the lower portion of FIG. 7 shows the energy level minimum of the conduction band in the buried channel for the virtual barrier and well and clocked barrier and well regions. Again, the effect of clocking metal gate 111 is to shift the conduction band energy levels in the clocked barrier and well regions above and below the fixed conduction band levels in the virtual barrier and well regions, as illustrated by the vertical arrows in the lower portion of FIG. 7.

Device 101 can be fabricated using steps similar to those described above for fabrication of device 51; although fabrication of device 101 may be simpler.

A particular application for device 101 is as an infrared sensor. The barrier for electron flow from metal 111 into n-type region 105 can be adjusted so that infrared excited electrons can surmount the barrier and be collected in the buried channel region and thereby detected. The problem of a large dark current is overcome in such a device by cooling the device to low temperatures as is typical for infrared detectors.

A third preferred embodiment uses reversed bias heterojunctions for the gates. More particularly, if gates 59 of device 51 were of a semiconductor material with a smaller energy band gap than the energy band gap of the material of channel barrier 57, then the electron barrier for electrons flowing from the gate into the buried channel can be adjusted by material selection. This would be useful in infrared detecting devices.

Figure 9:
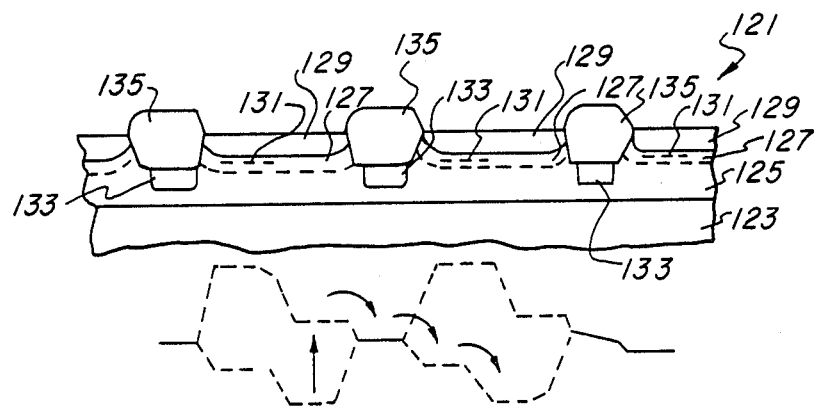
FIG. 9 shows the device of FIG. 3 adapted to a multi phase CCD.

The upper portion of FIG. 9 is a schematic cross section of fourth preferred embodiment device 121 which is, in essence, device 51 converted to a multiphase BCCD. Device 121 includes p-type silicon substrate 123, n-type layer 125 which contains the buried channel, p-type regions 127 which are the channel barriers, n+-type regions 129 which are the clocked gates, acceptor implants 131 in regions 127 which define the clocked barrier from the clocked well, p+-type regions 133 which are the virtual gates and connect to the channel stops (parallel to but not shown in the cross section of FIG. 9), and oxide 135. Each of clocked gates 129 - channel barriers 127 junctions is reversed biased and each of gates 129 may be independently biased relative to the two adjacent gates. Such independent biasing may transfer charge as shown by the buried channel energy levels in the lower portion of FIG. 9.

Device 121 has low leakage current between gates 129 and between gates 129 and virtual gates 133 due to the reverse bias of the gate 129 - channel barrier 127 junction.

Figure 10:
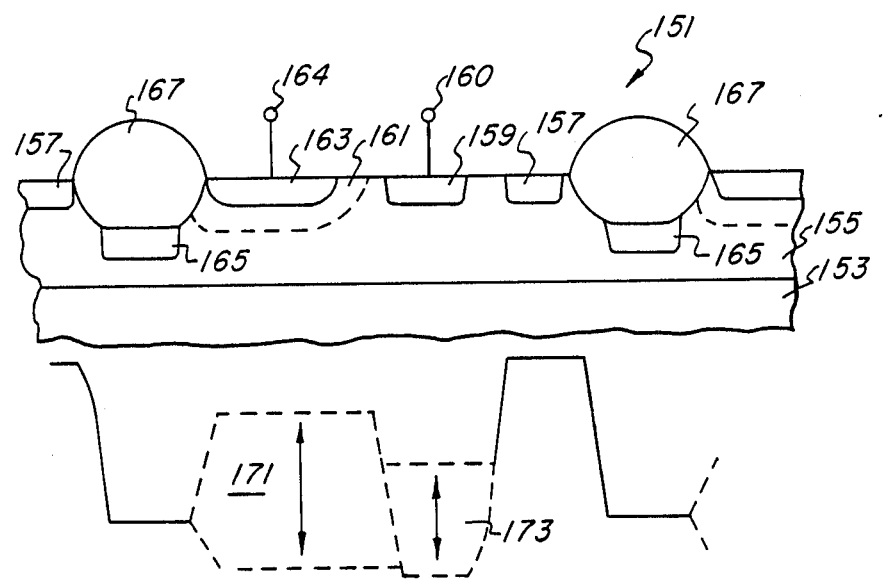
FIG. 10 shows a preferred embodiment random access memory cell.

The upper portion of FIG. 10 shows a schematic cross section of the fifth preferred embodiment of the invented device, which is a single cell of a random access memory and generally denoted 151. Device 151 includes p-type silicon substrate 153, n-type layer 155 which s a buried chanel, p+-type region 157 which is a channel stop, n+-type region 159 which connects to a work line 160, p-type region 161 which is a channel barrier, n+-type region 163 which connects to a bit line 164, p+-type region 165 which induces a storage region in channel 155, and oxide 167. The view in FIG. 10 is perpendicular to the analogous view in FIGS. 1, 3, 7, and 9 because the transfer of charge packets in device 151 is not along channel 155 but rather a transfer back and forth between the storage region in the channel under region 165 and the region in the channel under region 159. Analogous to device 51, the reverse bias on the n-p junction of regions 163 and 161 (i.e., the bit line bias) controls such transfer, as illustrated by arrow 171 in the channel energy level diagram in the lower portion of FIG. 10. Arrow 173 illustrates the level change for read/write a charge packet from/into the storage region. Again, the reverse bias on such n-p junction leads to low leakage currents.

Figure 11:
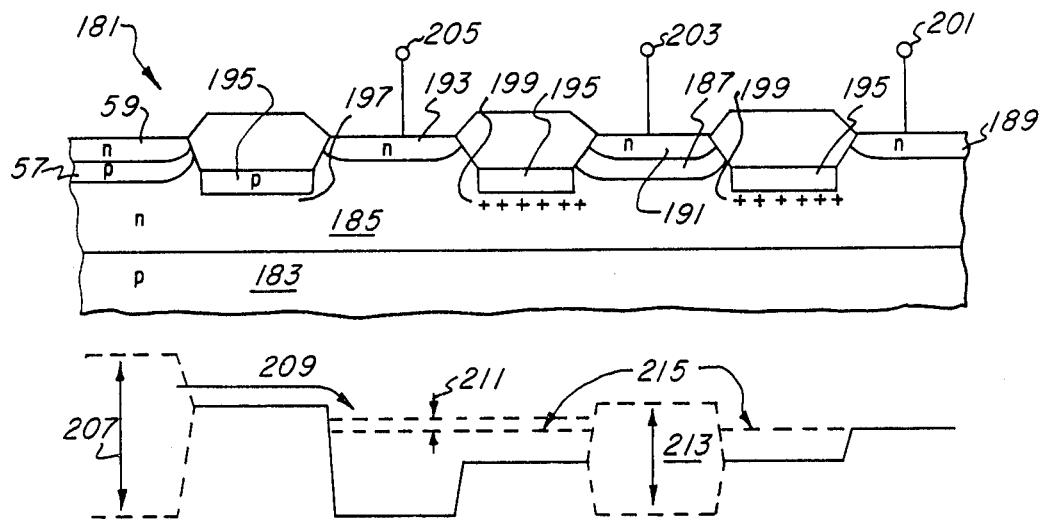
FIG. 11 is a schematic cross section of a preferred embodiment BCCD output node.
Figure 12:
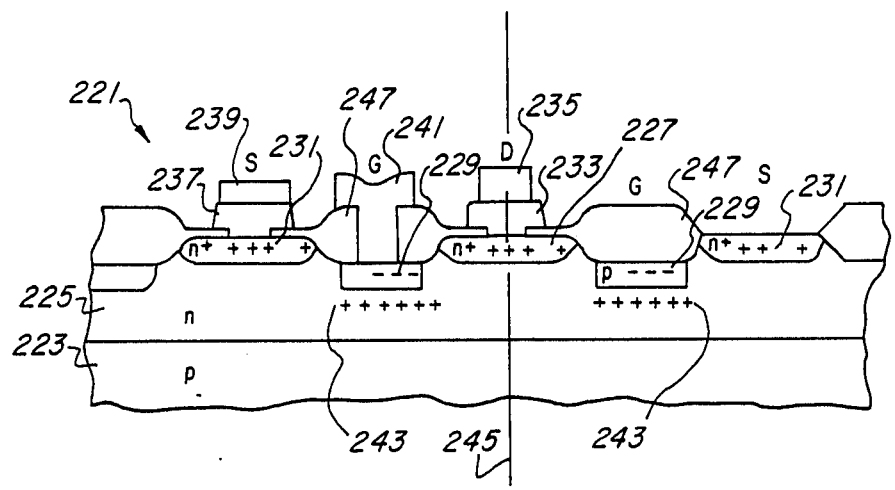
FIG. 12 is a schematic cross section of a preferred embodiment junction field effect transistor.
Figure 13:
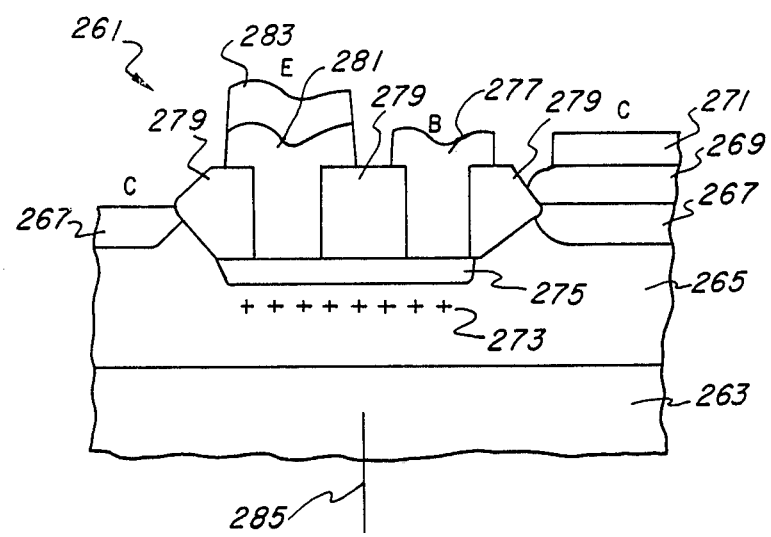
FIG. 13 is a schematic cross section of a preferred embodiment vertical bipolar transistor.

Further preferred embodiments of the inventive device are shown in FIGS. 11, 12, and 13, and illustrate the output node and amplifiers which could be used with a BCCD made of cells of device 51. In particular, the upper portion of FIG. 11 shows a schematic cross sectional view of an output node for a BCCD, and a lower portion of FIG. 11 shows the energy levels at the conduction band minimum and the flow of electrons in the same manner as the lower portions of FIGS. 1 and 3. The output node is generally denoted 181 and includes p-type substrate 183, n-type buried channel layer 185, p-type channel barrier 187, n-type diode region 189, n-type reset gate region 191, n-type floating diffusion region 193, virtual gate regions 195, virtual barrier region 197, virtual well implants 199, output diode line 201, reset gate line 203, and floating diffusion line 205. The left edge of the upper portion of FIG. 11, including channel barrier 57 and clocked gate region 59, represents the last cell in the BCCD, and upon clocking of this last cell, illustrated by arrow 207 in the energy level diagram in the lower portion of FIG. 11, the charge packet in this last cell spills over the virtual barrier below region 197 and into the well below the floating diffusion region 193, as illustrated by arrow 209. This charge packet increases the energy level inthe well below floating diffusion region 193, as illustrated by arrow 211; this increase in energy is sensed by floating diffusion line 205 and proceed, as more fully described below. After the charge packet is sensed, the well below floating diffusion region 193 is reset by reset gate line 203 being turned on, which lowers the energy level below reset gate region 191 and channel barrier 187, as shown by arrow 213; this lowering connects the well below floating diffusion region 193 to the virtual well below implants 199 and the region below output diode region 189 in the right hand portion of FIG. 11. The charge packet is thus drained off by output diode line 201 and the energy level in the well below floating diffusion 193 reestablished at the output diode level 215. Next, the reset gate line 203 is turned off and the energy level below reset gate region 191 and channel barrier 187 is raised, as illustrated by arrow 213, to again isolate the well below floating diffusion region 193 from the output diode region 189, and the floating diffusion line 205 is ready to sense the next charge packet delivered from the cell at the left hand portion of FIG. 11. Note that the structure illustrated in the upper portion of FIG. 11 is of the same general format as that of device 51, and can be simply fabricated by a few mask changes. In particular, the channel barriers below floating diffusion region 193 and output diode region 189 are omitted, the left hand virtual gate 195 only has implants that create a virtual barrier rather than a virtual well, and the virtual gates 195 in the center and right hand portion of FIG. 11 have implant 199 to create a virtual well beneath them. Thus, the total output node illustrated in FIG. 11 can easily be fabricated upon and along with a BCCD incorporating device 51 cells.

FIG. 12 is a schematic cross sectional view of a junction field effect transistor which can be used to amplify the charge packet signal sensed by floating diffusion line 205. Thi field effect transistor, generally denoted 221, also is fabricated in the general format of device 51 and inlcudes p-type substrate 223, n-type channel layer 225, n+-type drain region 227, p-type gate region 229, n+-type source region 231, drain polysilicon 233, drain metallization 235, source polysilicon 237, source metallization 239, gate metallization 241, gate implants 243, plus implants in the gate, source, and drain regions 229, 231, and 227. Device 221 is shown with enclosed topology; that is, device 221 is symmetric about axis 245 which is necessary to isolate the p+gate from the p+channel stops or peripheral field oxide. Floating diffusion line 205 may be connected to gate 241 and device 221 used to amplify the charge packet signal sensed in device 181. Again, device 221 is compatible with the processing of device 51, although the thick oxide 247 must be opened to form the gate 241 metallization contact with gate region 229.

In addition to the junction field effect transistor 221, a vertical bipolar transistor may be fabricated with process steps compatible to those for fabricating device 51. A schematic cross section of such a bipolar transistor, generally denoted 261, is shown in FIG. 13 and includes p-type substrate 263, n-type collector layer 265, n+-type collector region 267, n+ polysilicon 269, collector metallization 271, collector implant 273, p-type base 275, base metallization 277, thick oxide 279, n+ polysilicon 281, and emitter metallization 283. As with device 221, thick oxide 279 must be opened up in device 261 to make the base contact and the emitter 281. Note that the n+ polysilicon used in device 261 and 221 is the same as the n+ polysilicon used for buses in device 51; that is, there is no extra polysilicon step needed to fabricate devices 221 and 261. Also, the collector region 267 and device 261 and the source region 231 and drain region 227 and device 221 are simply the same as the clocked gate region 59 in device 51 but with channel barrier omitted. Further implant 273 is just the virtual well implant 65 in device 51. Again, no extra fabrication steps are needed. Lastly, device 261 has enclosed topology by making the collector symetrical about the axis 285 to isolate the base p1 region from the p+ peripheral regions.

In all of the preferred embodiment descriptions above, various items have been omitted for simplicity, such as protective oxides, metallizations, connections, and so forth.

The preferred embodiments may be modified in various ways, such as varying the doping levels, type of doping, materials, and dimensions.

I claim:

1. A gate structure for a buried channel charge coupled device, comprising:
  (a) a substrate of a first conductivity type;
  (b) a buried channel of opposite conductivity type on said substrate;
  (c) a semiconductor channel barrier on said buried channel, said channel barrier and said buried channel of opposite conductivity types; and
  (d) a semiconductor gate region on said channel barrier, said gate region and said channel barrier of opposite conductivity types;
  (e) a gate electrode of said first conductivity type in said buried channel; and
  (f) an isolation oxide over said gate electrode isolating channel barrier portions and gate electrode portions over said channel barrier portions from adjacent channel barrier portions and gate electrode portions.

2. The gate structure of claim 1, wherein:
  (a) the thickness and doping level of said channel barrier are characterized by means to provide substantially full depletion of said channel barrier during portions of the operation of said device in which said buried channel is depleted except for signal charge and said gate region is clocked.

3. A gate structure as set forth in claim 2, further including a donor implant in said buried layer beneath said gate electrode and closely adjacent thereto.

4. A gate structure as set forth in claim 3; further including an acceptor implant in said buried layer beneath a portion of said gate portion.

5. A gate structure as set forth in claim 1, further including a donor implant in said buried layer beneath said gate electrode and closely adjacent thereto.

6. A gate structure as set forth in claim 5, further including an acceptor implant in said buried layer beneath a portion of said gate region.

* * * * *